United States Patent
Chang et al.

(10) Patent No.: US 8,472,559 B2
(45) Date of Patent: Jun. 25, 2013

(54) POLAR TRANSMITTER AND RELATED SIGNAL TRANSMITTING METHOD

(75) Inventors: Hsiang-Hui Chang, Miaoli County (TW); Hsin-Hung Chen, Hsinchu County (TW); Chi-Hsueh Wang, Kaohsiung (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 305 days.

(21) Appl. No.: 12/987,154

(22) Filed: Jan. 9, 2011

(65) Prior Publication Data

US 2012/0177094 A1 Jul. 12, 2012

(51) Int. Cl.
*H03C 3/00* (2006.01)

(52) U.S. Cl.
USPC .......................................................... 375/302

(58) Field of Classification Search
USPC .......................................................... 375/302
See application file for complete search history.

(56) References Cited

U.S. PATENT DOCUMENTS

| | | | | |
|---|---|---|---|---|
| 7,532,679 | B2* | 5/2009 | Staszewski et al. | 375/295 |
| 7,576,623 | B1* | 8/2009 | Osman et al. | 332/145 |
| 8,126,409 | B2* | 2/2012 | Osman et al. | 455/102 |
| 8,140,030 | B2* | 3/2012 | Takinami et al. | 455/108 |
| 8,233,854 | B2* | 7/2012 | Li Puma et al. | 455/118 |
| 8,270,916 | B2* | 9/2012 | Pennec et al. | 455/127.1 |
| 2004/0151257 | A1* | 8/2004 | Staszewski et al. | 375/296 |
| 2005/0064830 | A1* | 3/2005 | Grigore | 455/127.4 |
| 2005/0151595 | A1* | 7/2005 | Pratt et al. | 331/16 |
| 2008/0304594 | A1* | 12/2008 | Schell et al. | 375/300 |
| 2009/0054018 | A1* | 2/2009 | Waheed et al. | 455/126 |
| 2009/0275358 | A1* | 11/2009 | Feltgen et al. | 455/550.1 |
| 2009/0291648 | A1* | 11/2009 | Lee | 455/102 |

OTHER PUBLICATIONS

Elliott, "A polar modulator transmitter for GSM/EDGE" IEEE Journal of Solid-State, vol. 39, Issue: 12, Publication Year: 2004, pp. 2190-2199.*

* cited by examiner

*Primary Examiner* — Juan A Torres
(74) *Attorney, Agent, or Firm* — Winston Hsu; Scott Margo

(57) ABSTRACT

A polar transmitter includes: a processor arranged to convert signals from a specific coordinate system to a polar coordinate system, wherein the signals in the polar coordinate system comprises a phase component and an amplitude component; a phase modulation (PM) path configured to have a constant PM group delay, for processing the phase component; an amplitude modulation (AM) path, of which an AM group delay is capable of being determined, for processing the amplitude component; and an adjustable delay circuit, arranged to adjust delay of the signals in the specific coordinate system according to the constant PM group delay and the calibrated AM group delay.

20 Claims, 7 Drawing Sheets

POLAR TRANSMITTER AND RELATED SIGNAL TRANSMITTING METHOD

BACKGROUND

The present invention relates to a polar transmitter and related signal transmitting method, and more particularly to a polar transmitter which delays an in-phase signal and a quadrature signal before input into a Coordinate Rotation Digital Computer to make a converted amplitude component synchronizes with a converted phase component, and a method thereof.

A polar transmitter offers some advantages, such as a potential for reducing complexity and current consumption in the modulator path as well as eliminating the problem of image rejection, thus the polar transmitter is more suitable for implementation in advanced complementary metal oxide semiconductor (CMOS) processing technologies. More specifically, the polar transmitter is a transmitting device that converts a complex signal represented by amplitude information and phase information rather than an in-phase component and a quadrature component into a transmitting signal. In the polar transmitter, the amplitude information and the phase information are first generated from a baseband input signal generated by a baseband circuit. Next, the amplitude information is modulated into an up-converted amplitude component, and the phase information is modulated into an up-converted phase component. Then, the up-converted amplitude component and the up-converted phase component are mixed up, such as by a mixer, to generate the transmitting signal. However, the delay time caused by the amplitude modulating path may different from the delay time caused by the phase modulating path since the two paths are operated differently. If this happens, the timing of the up-converted amplitude component arriving at the mixer may deviate from the timing of the up-converted phase component arriving at the mixer. Accordingly, an inaccurate transmitting signal may by generated by the mixer. Therefore, how to synchronize the timings between the up-converted amplitude component and the up-converted phase component is a significant concern in the field of polar transmitter.

SUMMARY

One of the objectives of the present invention is therefore to provide a polar transmitter of which delays an in-phase signal and a quadrature signal before input into a Coordinate Rotation Digital Computer to make a converted amplitude component synchronizes with a converted phase component, and a method thereof.

According to a first embodiment of the present invention, a polar transmitter is disclosed. The polar transmitter comprises a processor, a phase modulation (PM) path, an amplitude modulation (AM) path, and an adjustable delay circuit. The processor is arranged to convert signals from a specific coordinate system to a polar coordinate system, wherein the signals in the polar coordinate system comprises a phase component and an amplitude component. The PM path is configured to have a constant PM group delay for processing the phase component. The AM path, of which an AM group delay is capable of being determined, for processing the amplitude component. The adjustable delay circuit is arranged to adjust delay of the signals in the specific coordinate system according to the constant PM group delay and the calibrated AM group delay.

According to a second embodiment of the present invention, a signal transmitting method of a polar transmitter comprising a PM path and an AM path is disclosed. The signal transmitting method comprises: converting signals from a specific coordinate system to a polar coordinate system, wherein the signals in the polar coordinate system comprises a phase component and an amplitude component; determining an AM group delay of the AM path; and adjusting delay of the signals in the specific coordinate system according to a constant PM group delay and the determined AM group delay, wherein the PM path is configured to have the constant PM group delay.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1A:
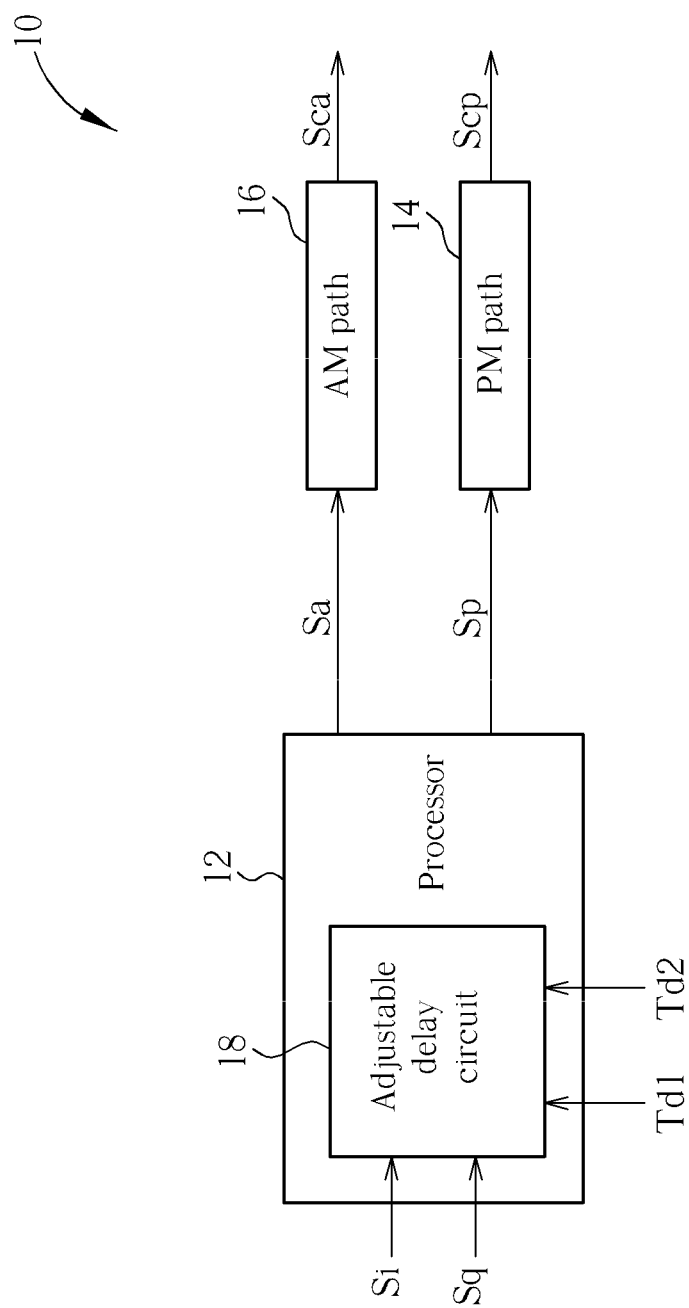
FIG. 1A is a diagram illustrating a polar transmitter according to an embodiment of the present invention.
Figure 1B:
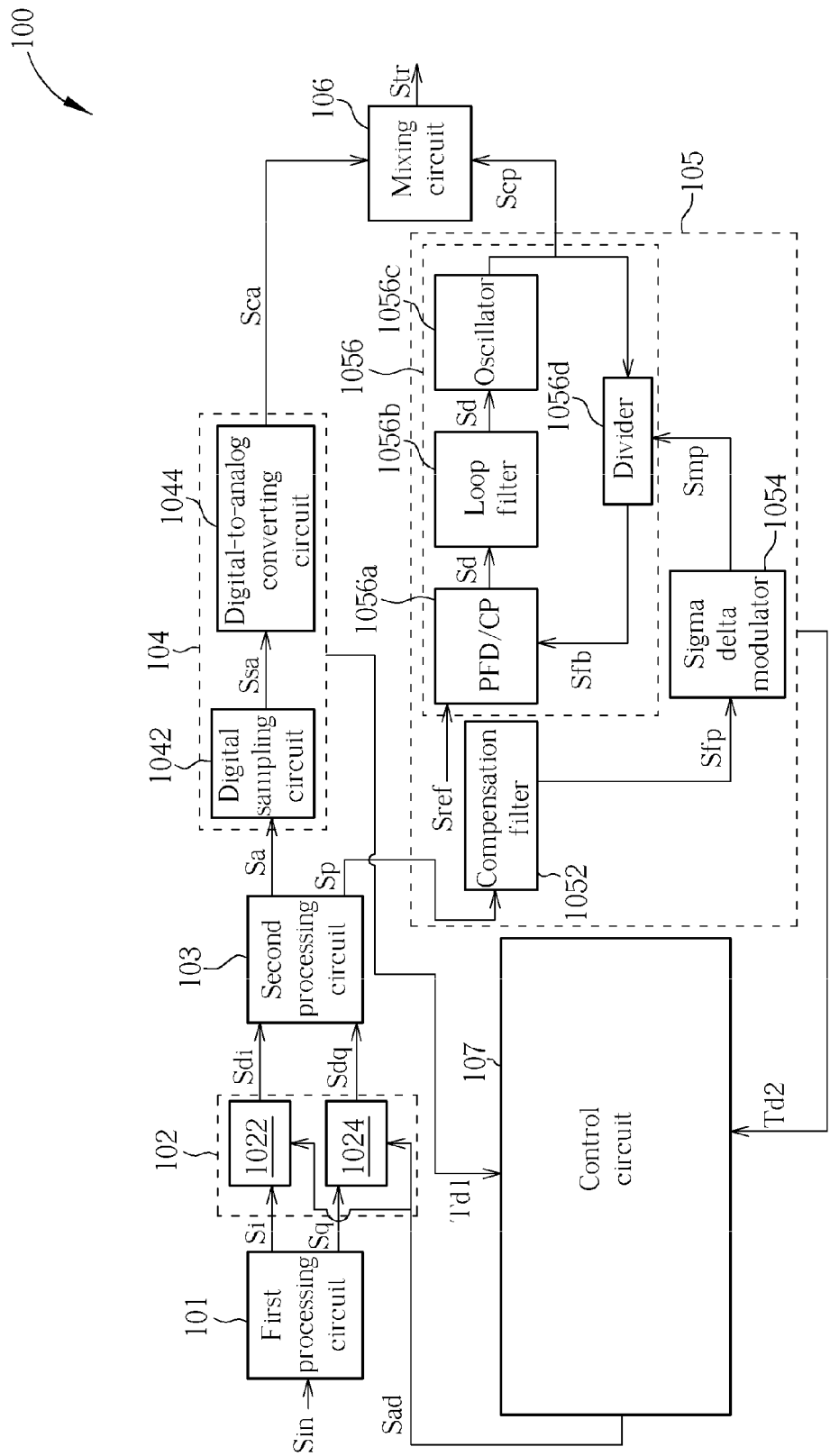
FIG. 1B is a diagram illustrating a detailed polar transmitter according to an embodiment of the present invention.

Please refer to FIG. 1A. FIG. 1A is a diagram illustrating a polar transmitter 10 according to an embodiment of the present invention. The polar transmitter 10 comprises a processor 12, a PM path 14, an AM path 16, and an adjustable delay circuit 18. The processor 12 is arranged to convert signals from a specific coordinate system, e.g., I/Q coordinate system, to a polar coordinate system, wherein the signals in the polar coordinate system comprises a phase component Sp and an amplitude component Sa. The PM path 14 is configured to have a constant PM group delay for processing the phase component Sp. The AM path 16, of which an AM group delay is capable of being determined, is used for processing the amplitude component Sa. The adjustable delay circuit 18 is arranged to adjust delay of the signals in the specific coordinate system according to the constant PM group delay and the calibrated AM group delay. More specifically, the detailed circuit diagram of the polar transmitter 10 is shown in FIG. 1B. FIG. 1B is a diagram illustrating the detailed polar transmitter 100 according to an embodiment of the present invention. The polar transmitter 100 comprises a first processing circuit 101, a delay circuit 102, a second processing circuit 103, a first converting circuit 104, a second converting circuit 105, a mixing circuit 106, and a control circuit 107, in which the above-mentioned processor 12 comprises the first processing circuit 101 and the second processing circuit 103, the adjustable delay circuit 18 is the delay circuit 102, the PM path 14 is the second converting circuit 105, and the AM path 16 is the first converting circuit 104. The first processing circuit 101 is arranged to generate a first signal comprising an in-phase component Si and a quadrature component Sq. The delay circuit 102 is arranged to delay the first signal to generate a second signal comprising a delayed in-phase signal Sdi and a delayed quadrature signal Sdq.

The second processing circuit 103 is arranged to process the second signal to generate an amplitude component Sa and a phase component Sp of the second signal. The first converting circuit 104 is arranged to convert the amplitude component Sa to generate a converted amplitude component Sca. The second converting circuit 105 is arranged to convert the phase component Sp to generate a converted phase component Scp. The mixing circuit 106 is arranged to combine the converted amplitude component Sca and the converted phase component Scp to generate a transmitting signal Str. Furthermore, the delay circuit 102 is arranged to delay the first signal according to the AM group delay Td1 of the first converting circuit 104 and a constant PM group delay Td2 of the second converting circuit 105. More specifically, the delay circuit 102 is arranged to delay at least one of the in-phase component Si and the quadrature component Sq to generate the delayed in-phase signal Sdi and the delayed quadrature signal Sdq while the PM path 14 and the AM path 16 are not synchronous. The control circuit 107 is arranged to control the delay circuit 102 by an adjusting signal Sad indicative of a time difference between the constant PM group delay and the calibrated AM group delay. Then, the delay circuit 102 delays the first signal according to the adjusting signal Sad such that the converted amplitude component Sca synchronizes with the converted phase component Scp. In other words, the delay circuit 102 may not limit to delaying the first signal such that the converted amplitude component Sca and the converted phase component Scp reach the mixing circuit 106 substantially at a same time, the delay circuit 102 may also delay the first signal such that the converted amplitude component Sca and the converted phase component Scp reach the mixing circuit 106 at different time but synchronize with each other. The delay circuit 102 comprises a first delay unit 1022 and a second delay unit 1024. The first delay unit 1022 is arranged to delay the in-phase component Si according to the AM group delay Td1 and the constant PM group delay Td2 to generate the delayed in-phase signal Sdi. The second delay unit 1024 is arranged to delay the quadrature component Sq according to the AM group delay Td1 and the constant PM group delay Td2 to generate the delayed quadrature signal Sdq.

The first converting circuit 104 comprises a digital sampling circuit 1042 and a digital-to-analog converting circuit 1044. The digital sampling circuit 1042 is arranged to sample the amplitude component Sa to generate a sampled amplitude component Ssa. The digital-to-analog converting circuit 1044 is arranged to convert the sampled amplitude component Ssa to generate the converted amplitude component Sca.

The second converting circuit 105 comprises a compensation filter 1052, a sigma delta modulator 1054, and a phase locked loop 1056. The compensation filter 1052 is arranged to process the phase component Sp to generate a filtered phase component Sfp. The sigma delta modulator 1054 is arranged to modulate the filtered phase component Sfp to generate a modulated phase component Smp. The phase locked loop 1056 is arranged to generate the converted phase component Scp according to the modulated phase component Smp. Furthermore, the compensation filter 1052 processes the phase component Sp to compensate the filtering effect caused by the phase locked loop 1056. For example, the compensation filter 1052 processes the phase component Sp to calibrate a time constant and a loop gain of the phase locked loop 1056 such that the second converting circuit 105 has a constant group delay. It should be noted that the constant group delay of the second converting circuit 105 means that the delays of different signals in a frequency band (e.g., in-band signal) caused by the second converting circuit 105 are substantially constant.

According to an application of the present embodiment, the polar transmitter 100 may be a transmitting module of the Enhanced Data rates for Global Evolution (EDGE) system. The first processing circuit 101 may receive a digital based signal Sin from a field-programmable gate array (FPGA) circuit and perform an Eight Phase Shift Keying (8-PSK) modulation upon the digital based signal to generate the digital based first signal, i.e., the in-phase component Si and the quadrature component Sq. It should be noted that the second signal, i.e., the delayed in-phase component Sdi and the delayed quadrature component Sdq, generated by the delay circuit 102 is also the digital based signal. Furthermore, the second processing circuit 103 may be a Coordinate Rotation Digital Computer (CORDIC) to convert the delayed in-phase component Sdi and the delayed quadrature component Sdq with respect to the Cartesian coordinate into the amplitude component Sa and the phase component Sp of the second signal with respect to the Polar coordinate.

Furthermore, the digital sampling circuit 1042 may be applied for up-sampling the baseband amplitude component Sa to generate the up-sampled amplitude component, i.e., the sampled amplitude component Ssa. Therefore, the digital sampling circuit 1042 may comprise an up-sampling circuit and a mismatch shaping modulator in one application of the present invention, wherein the up-sampling circuit up-samples the amplitude component Sa to generate a high frequency amplitude component, and the mismatch shaping modulator reduces the mismatch of the high frequency amplitude component to generate the sampled amplitude component Ssa. In addition, the digital-to-analog converting circuit 1044 may be applied to convert the digital based signal, i.e., the sampled amplitude component Ssa, into the analog based signal, i.e., the converted amplitude component Sca. Therefore, the digital-to-analog converting circuit 1044 may comprise a digital-to-analog converter (DAC) and a filter in one application of the present invention, wherein the digital-to-analog converter converts the sampled amplitude component Ssa into an analog signal, and the filter performs a filtering process upon the analog signal to generate the converted amplitude component Sca.

Furthermore, a differentiator may be applied to differentiate the phase component Sp and accordingly generate a differentiated output signal to the compensation filter 1052. The phase locked loop 1056 may comprise a phase detector/charge pump circuit (PFD/CP) 1056a, a loop filter 1056b, an oscillator 1056c, and a divider 1056d. The divider 1056d performs a frequency dividing operation upon the converted phase component Scp with respect to the modulated phase component Smp. The PFD/CP detects the phase difference between a reference signal Sref and a feedback signal Sfb generated by the divider 1056d to generate a detect output signal Sd for the loop filter 1056b. The oscillator 1056c generates the converted phase component Scp according to a filter output signal Sf generated by the loop filter 1056b.

On one hand, when the polar transmitter 100 is under operation, the compensation filter 1052, the sigma delta modulator 1054, and the phase locked loop 1056 are adjusted to have the constant group delay, i.e., the constant PM group delay Td2, from the phase component Sp to the converted phase component Scp. Next, the control circuit 107 detects the constant PM group delay Td2. Then, the constant PM group delay Td2 caused by the compensation filter 1052, the sigma delta modulator 1054, and the phase locked loop 1056 can be obtained On the other hand, the control circuit 107 detects the AM group delay Td1 of the first converting circuit 104. Then, the AM group delay Td1 caused by the digital sampling circuit 1042 and the digital-to-analog converting circuit 1044 can be obtained.

When the AM group delay Td1 and the constant PM group delay Td2 are obtained, the control circuit 107 further determines if the converted amplitude component Sca leads the converted phase component Scp or the converted phase component Scp leads the converted amplitude component Sca according to the AM group delay Td1 and the constant PM group delay Td2. When the control circuit 107 determines that the converted amplitude component Sca leads the converted phase component Scp, the control circuit 107 generates the adjusting signal Sad to adjust the delay time of the first delay unit 1022. More specifically, in one example, when the converted amplitude component Sca leads the converted phase component Scp, the control circuit 107 generates the adjusting signal Sad to prolong the delay time of the first delay unit 1022 and keep the delay time of the second delay unit 1024 intact in order to make the converted amplitude component Sca synchronizes with the converted phase component Scp or to make the converted amplitude component Sca and the converted phase component Scp reach the mixing circuit 106 substantially at the same time. It should be noted that the control circuit 107 may generate the adjusting signal Sad to adjust the delay times of the second delay unit 1024 and the first delay unit 1022 at the same time.

When the control circuit 107 determines that the converted phase component Scp leads the converted amplitude component Sca, the control circuit 107 generates the adjusting signal Sad to adjust the delay time of the second delay unit 1024. More specifically, in one example, when the converted phase component Scp leads the converted amplitude component Sca, the control circuit 107 generates the adjusting signal Sad to prolong the delay time of the second delay unit 1024 and keep the delay time of the first delay unit 1022 intact in order to make the converted amplitude component Sca synchronizes with the converted phase component Scp or to make the converted amplitude component Sca and the converted phase component Scp reach the mixing circuit 106 substantially at the same time. It should be noted that the control circuit 107 may generate the adjusting signal Sad to adjust the delay times of the second delay unit 1024 and the first delay unit 1022 at the same time.

Accordingly, by repeatedly detecting the AM group delay Td1 and the constant PM group delay Td2 and adjusting the delay times of the first delay unit 1022 and/or the second delay unit 1024 accordingly, the converted amplitude component Sca and the converted phase component Scp can be synchronized with each other or reach the mixing circuit 106 substantially at the same time.

Figure 2:
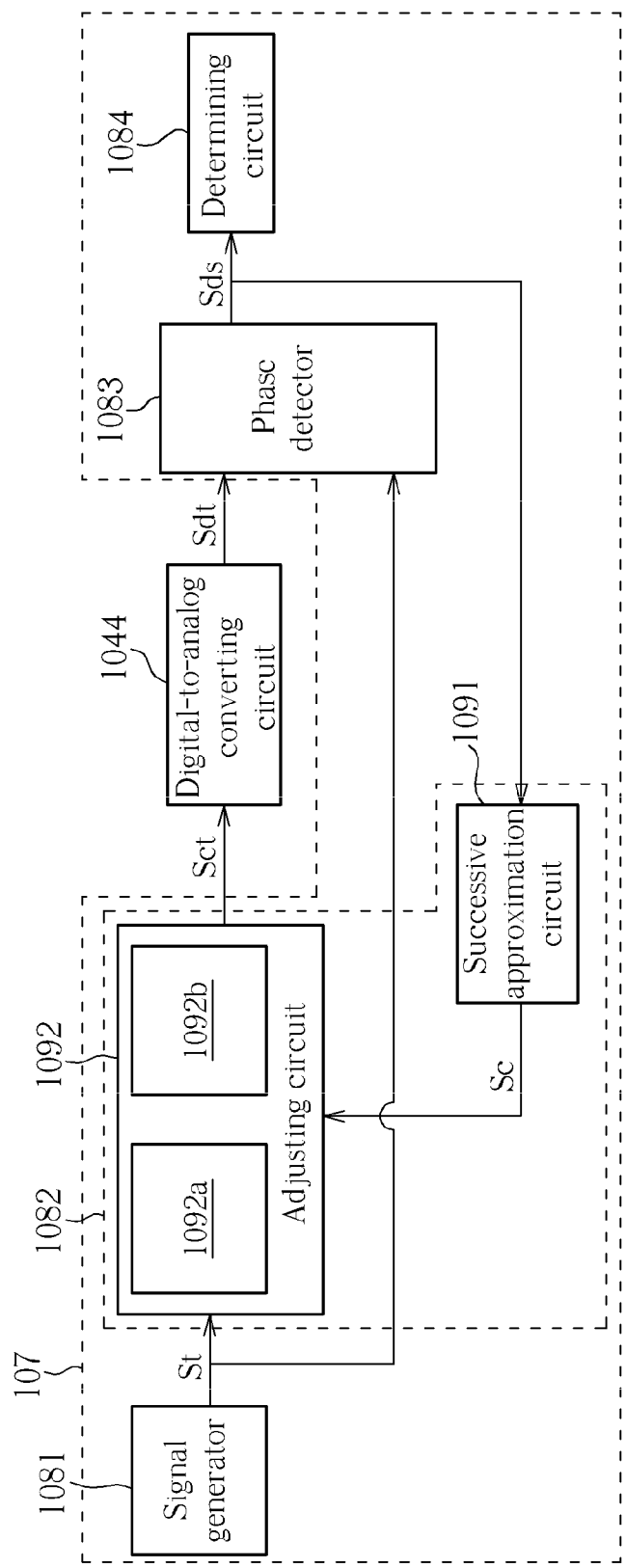
FIG. 2 is a diagram illustrating a detecting circuit according to an embodiment of the present invention.

Please refer to FIG. 2. FIG. 2 is a diagram illustrating a part of the control circuit 107 according to an embodiment of the present invention. Please note that the digital-to-analog converting circuit 1044 is also included in FIG. 2 to clearly illustrate the operation of the control circuit 107. Basically, the method disclosed in FIG. 2 can be modified to measure the AM group delay Td1. However, only the digital-to-analog converting circuit 1044 is included in FIG. 2 is for the sake of brevity. The part of the control circuit 107 comprises a signal generator 1081, a calibrating circuit 1082, a phase detector 1083, and a determining circuit 1084. The signal generator 1081 is arranged to generate a test signal St having a predetermined period Tp. The calibrating circuit 1082 is arranged to selectively provide a delay time upon the test signal St to generate a calibrated test signal Sct according to a detecting signal Sds, wherein the calibrated test signal Sct is inputted into the digital-to-analog converting circuit 1044 to generate a delayed test signal Sdt. The phase detector 1083 is arranged to receive the test signal St and the delayed test signal Sdt, and to detect a phase difference between the test signal St and the delayed test signal Sdt to generate the detecting signal Sds, wherein the calibrating circuit 1082 is arranged to calibrate the delay time until the phase difference between the delayed test signal Sdt and the test signal St reaches a predetermined value. Furthermore, the determining circuit 1084 is arranged to detect the delay (i.e., T2) of the digital-to-analog converting circuit 1044 according to the predetermined period Tp and the delay time when the phase difference between the delayed test signal Sdt and the test signal St reaches the predetermined value.

It should be noted, in one embodiment of the present invention, the predetermined value is set to zero, but this is not a limitation of the present invention. When the phase difference between the delayed test signal Sdt and the test signal St is calibrated to substantially zero, the determining circuit 1084 determines that the delay T2 is equal to a time difference between the predetermined period Tp and the delay time.

More specifically, the calibrating circuit 1082 comprises a successive approximation register (SAR) 1091 and an adjusting circuit 1092. The successive approximation register (SAR) is arranged to generate a code Sc having a plurality of bits according to the detecting signal Sds. The adjusting circuit 1092 is arranged to adjust the delay time upon the test signal St to generate the calibrated test signal Sct according to the code Sc, wherein the successive approximation register 1091 updates at least one bit in the code Sc once the detecting signal Sds is updated. Furthermore, in one embodiment, the adjusting circuit 1092 comprises a look-up table 1092a and a delay setting circuit 1092b. The look-up table 1092a is arranged to store a plurality of candidate delay times mapped to a plurality of candidate values of the code Sc. The delay setting circuit 1092b is arranged to set the delay time by selecting a candidate delay time from the look-up table 1092a according to an actual value of the code Sc, and provide the delay time upon the test signal St to generate the calibrated test signal Sct.

Figure 3:
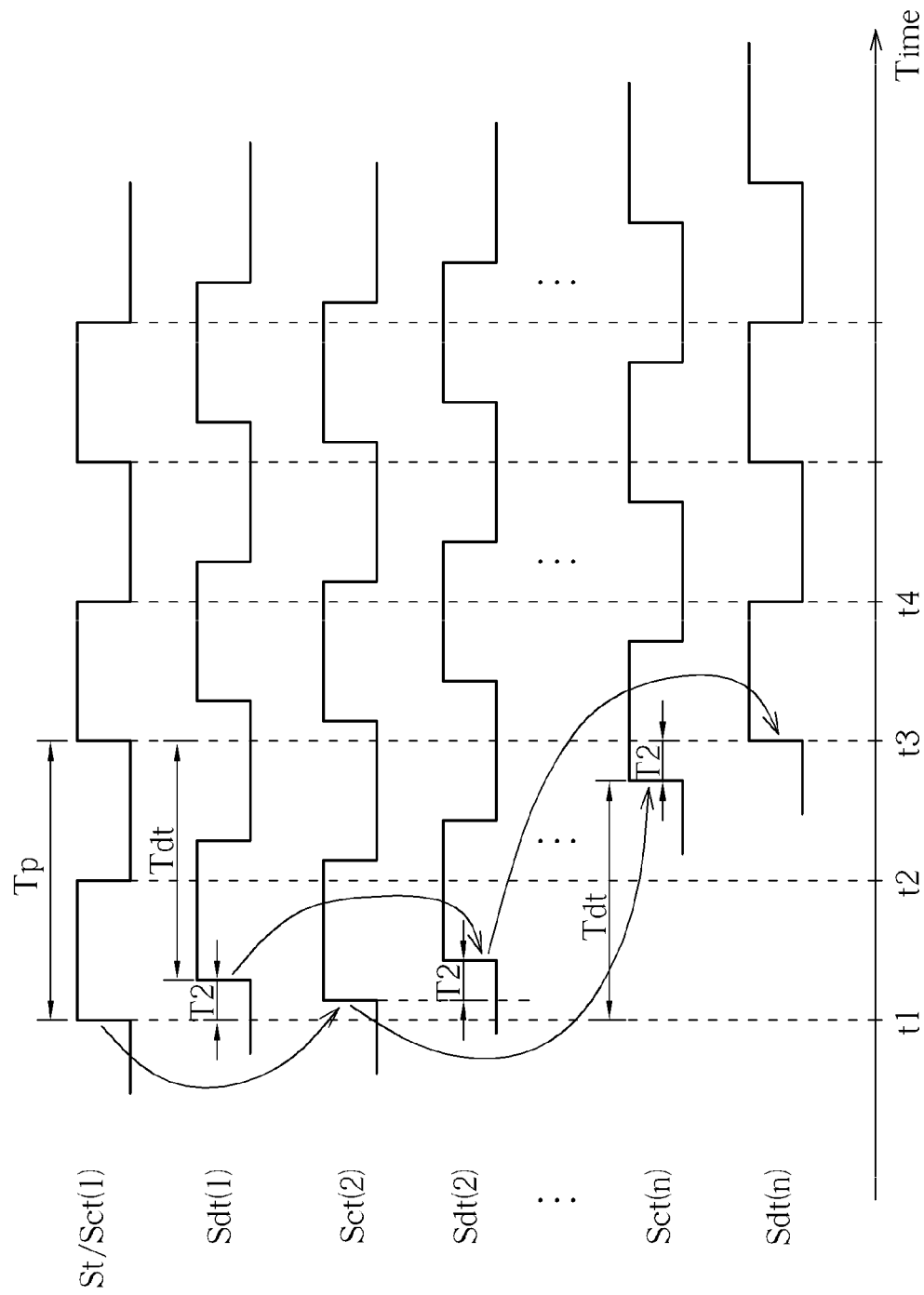
FIG. 3 is a timing diagram illustrating a test signal, a calibrated test signal, and a delayed test signal according to an embodiment of the present invention.

Please refer to FIG. 3. FIG. 3 is a timing diagram illustrating the test signal St, the calibrated test signal Sct, and the delayed test signal Sdt according to an embodiment of the present invention. Initially, the delay setting circuit 1092b sets the delay time as zero. Then, the signal generator 1081 generates the test signal St to inject into the adjusting circuit 1092 at time t1. At time t2, the delayed test signal Sdt(1)

reaches the phase detector 1083. Then, the phase detector 1083 detects the phase difference between the test signal St and the delayed test signal Sdt(1) to generate the detecting signal Sds. It should be noted that, since the delay time is set to zero initially, the calibrated test signal Sct(1) is substantially equal to the test signal St, and the phase difference between the test signal St and the delayed test signal Sdt(1) is substantially equal to the delay T2. Therefore, the delay T2 can be obtained by subtracting the time difference Tdt from the predetermined period Tp as shown in FIG. 3. In other words, the time difference Tdt should be obtained first.

According to this embodiment, the phase detector 1083 detects the test signal St and the delayed test signal Sdt(1) to determine if the phase of the test signal St is aligned with the phase of the delayed test signal Sdt(1). For this example, the phase of the test signal St is not aligned with the phase of the delayed test signal Sdt(1), and the phase detector 1083 generates the detecting signal Sds to the successive approximation register 1091. Then, the successive approximation register 1091 generates the code Sc according to the detecting signal Sds. It should be noted that the code Sc can be a code having a plurality of bits, wherein the successive approximation register 1091 updates at least one bit in the code Sc once the detecting signal Sds is updated.

Since one code is mapped to one candidate delay time in the look-up table 1092*a*, the delay setting circuit 1092*b* selects one candidate delay time from the look-up table as the delay time according to the updated code Sc. Then, the delay setting circuit 1092*b* provides the delay time upon the test signal St to generate the calibrated test signal Sct(2). Then, at time t3, the delayed test signal Sdt(2) reaches the phase detector 1083. Again, the phase detector 1083 detects the phase difference between the test signal St and the delayed test signal Sdt(2) to generate the detecting signal Sds, and the calibrating circuit 1082 calibrates the delay time to generate the calibrated test signal Sct.

Accordingly, by repeating the above-mentioned operation, the phase of the delayed test signal Sdt will approach the phase of the test signal St. Finally, the phase of the delayed test signal Sdt(n) will align with the phase of the test signal St at time t4 as shown in FIG. 3. When the phase of the delayed test signal Sdt(n) aligns with the phase of the test signal St (i.e., when the phase difference between the delayed test signal Sdt and the test signal St reaches the predetermined value), the corresponding delay time set for the calibrated test signal Sct(n) is the time difference Tdt. When the time difference Tdt is obtained, the delay T2 can be obtained by the following equation (1):

$$T2=Tp-Tdt. \quad (1)$$

In other words, when the determining circuit 1084 detects that the phase difference between the delayed test signal Sdt and the test signal St is calibrated to substantially zero, the determining circuit 1084 utilizes the above-mentioned equation (1) to calculate the delay T2.

It should be noted that the above-mentioned adjusting circuit 1092 is just an exemplary embodiment, those skilled in the art will understand that a sine ROM (Read-only-memory) table may also have the similar effects. Furthermore, even though the delay circuit 102 is installed between the first processing circuit 101 and the second processing circuit 103 in this embodiment, this is not a limitation of the present invention. In other words, the delay circuit 102 can be installed in any position before the second processing circuit 103, which also belongs to the scope of the present invention.

Figure 4A:
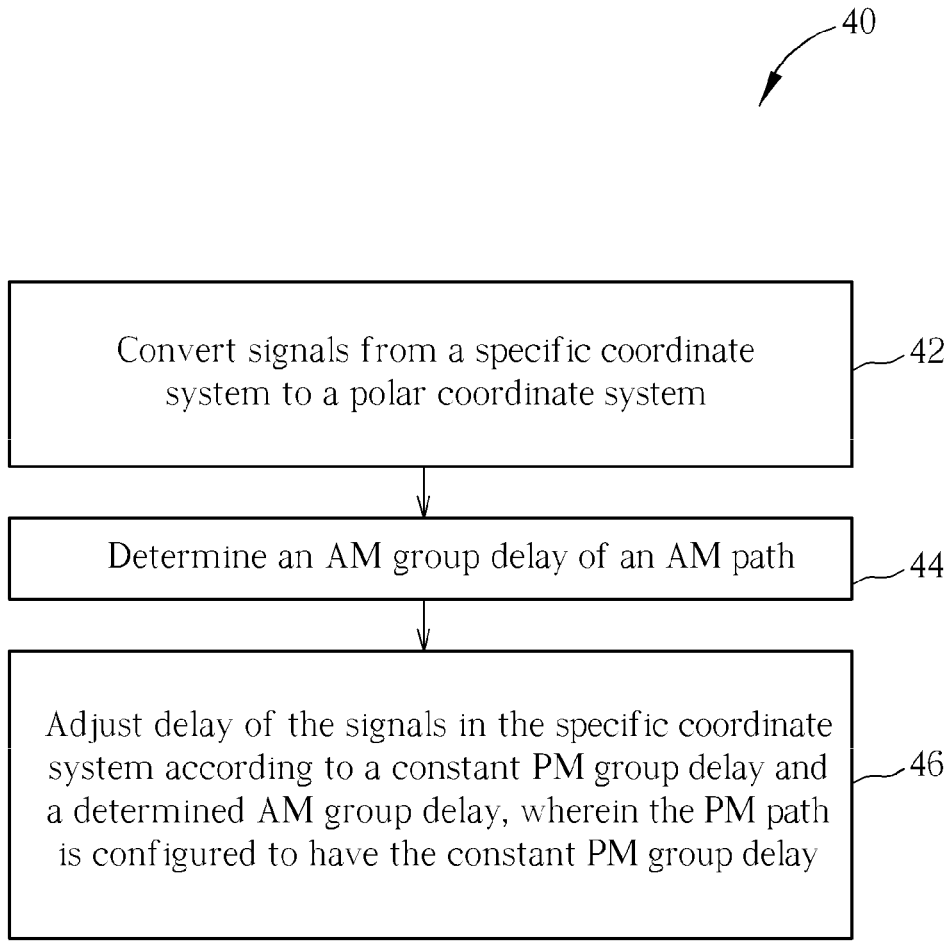
FIG. 4A is a flowchart illustrating a signal transmitting method of a polar transmitter comprising a PM path and an AM path according to an embodiment of the present invention.

Please refer to FIG. 4A. FIG. 4A is a flowchart illustrating a signal transmitting method 40 of a polar transmitter comprising a PM path and an AM path according to an embodiment of the present invention. The signal transmitting method 40 is for generating a transmitting signal according to an amplitude component and a phase component with respect to the Polar coordinate. Therefore, the above-mentioned embodiments of polar transmitter 10 may be regarded as employing the signal transmitting method 40 to generate the transmitting signal. For simplicity, the detailed description of the signal transmitting method 40 is described in conjunction with the polar transmitter 10. Furthermore, provided that substantially the same result is achieved, the steps of the flowchart shown in FIG. 4A need not be in the exact order shown and need not be contiguous, that is, other steps can be intermediate. The signal transmitting method 40 comprises:

Step 42: Convert signals from a specific coordinate system to a polar coordinate system, wherein the signals in the polar coordinate system comprises the phase component Sp and an amplitude component Sa;

Step 44: Determine the AM group delay Td1 of the AM path 16; and

Step 46: Adjust delay of the signals in the specific coordinate system according to the constant PM group delay Td2 and the determined AM group delay Td1, wherein the PM path 14 is configured to have the constant PM group delay Td2.

Figure 4B:
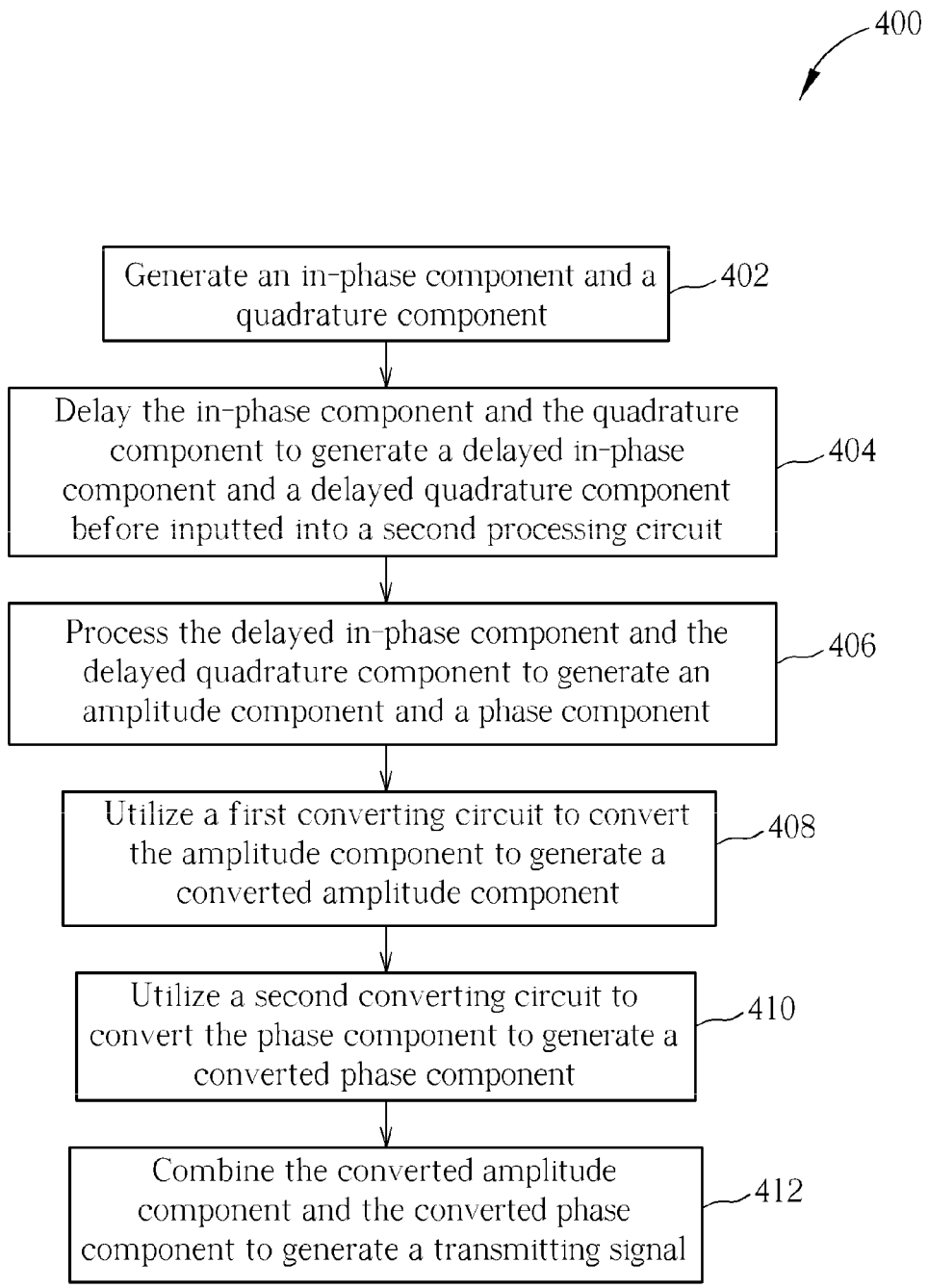
FIG. 4B is a flowchart illustrating a signal transmitting method according to an embodiment of the present invention.

Please refer to FIG. 4B. FIG. 4B is a flowchart illustrating a signal transmitting method 400 according to an embodiment of the present invention. The signal transmitting method 400 is for generating a transmitting signal according to an amplitude component and a phase component with respect to the Polar coordinate. Therefore, the above-mentioned embodiments of polar transmitter 100 may be regarded as employing the signal transmitting method 400 to generate the transmitting signal. For simplicity, the detailed description of the signal transmitting method 400 is described in conjunction with the polar transmitter 100. Furthermore, provided that substantially the same result is achieved, the steps of the flowchart shown in FIG. 4B need not be in the exact order shown and need not be contiguous, that is, other steps can be intermediate. The signal transmitting method 400 comprises:

Step 402: Generate the in-phase component Si and the quadrature component Sq;

Step 404: Delay the in-phase component Si and the quadrature component Sq to generate the delayed in-phase component Sdi and the delayed quadrature component Sdq before inputted into the second processing circuit 103 according to the AM group delay Td1 of the first converting circuit 104 and the constant PM group delay Td2 of the second converting circuit 105;

Step 406: Process the delayed in-phase component Sdi and the delayed quadrature component Sdq to generate the amplitude component Sa and the phase component Sp;

Step 408: Utilize the first converting circuit 104 to convert the amplitude component Sa to generate the converted amplitude component Sca;

Step 410: Utilize the second converting circuit 105 to convert the phase component Sp to generate the converted phase component Scp; and Step 412: Combine the converted amplitude component Sca and the converted phase component Scp to generate the transmitting signal Str.

Figure 5:
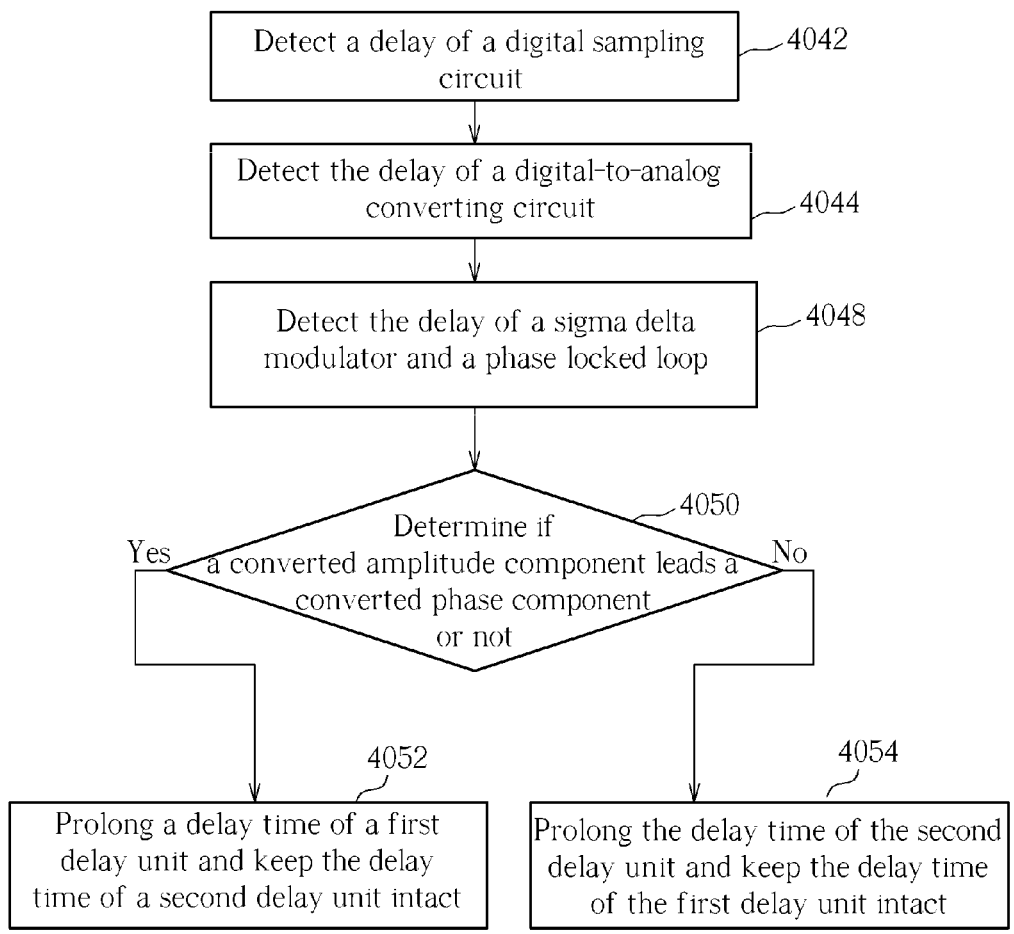
FIG. 5 is a flowchart illustrating the steps of delaying an in-phase signal and a quadrature signal to generate a delayed in-phase signal and a delayed quadrature signal according to an embodiment of the present invention.

It should be noted that the first converting circuit 104 comprises the digital sampling circuit 1042 and the digital-to-analog converting circuit 1044, therefore the AM group delay Td1 is summation of the delay of the digital sampling circuit 1042 and the delay (i.e., T2) of the digital-to-analog converting circuit 1044. The second converting circuit 105 comprises the compensation filter 1052, the sigma delta modulator 1054, and the phase locked loop 1056, therefore the constant PM group delay Td2 is summation of the delays of the compensation filter 1052, the sigma delta modulator 1054, and the phase locked loop 1056. Therefore, step 404 in the signal transmitting method 400 further comprises the following steps as shown in FIG. 5. FIG. 5 is a flowchart illustrating the steps of delaying the in-phase component Si and the quadrature component Sq to generate the delayed in-phase component Sdi and the delayed quadrature component Sdq according to an embodiment of the present invention. The steps comprise:

Step 4042: Detect the delay of the digital sampling circuit 1042;

Step 4044: Detect the delay T2 of the digital-to-analog converting circuit 1044;

Step 4048: Detect the constant PM group delay Td2;

Step 4050: Determine if the converted amplitude component Sca leads the converted phase component Scp or not, if yes go to step 4052, if no go to step 4054;

Step 4052: Prolong the delay time of the first delay unit 1022 and keep the delay time of the second delay unit 1024 intact;

Step 4054: Prolong the delay time of the second delay unit 1024 and keep the delay time of the first delay unit 1022 intact.

It should be noted that when the polar transmitter 100 is under operation, the AM group delay Td1 is the summation of the delay of the digital sampling circuit 1042 and the delay T2 of the digital-to-analog converting circuit 1044. The compensation filter 1052, the sigma delta modulator 1054, and the phase locked loop 1056 are adjusted to have the constant group delay from the phase component Sp to the converted phase component Scp. When the AM group delay Td1 and the constant PM group delay Td2 are, it can be determine if the converted amplitude component Sca leads the converted phase component Scp or the converted phase component Scp leads the converted amplitude component Sca according to the AM group delay Td1 and the constant PM group delay Td2. When the converted amplitude component Sca leads the converted phase component Scp, the control circuit 107 generates the adjusting signal Sad to prolong the delay time of the first delay unit 1022 and keep the delay time of the second delay unit 1024 intact to make the converted amplitude component Sca synchronizes with the converted phase component Scp or make the converted amplitude component Sca and the converted phase component Scp reach the mixing circuit 106 substantially at the same time (Step 4052). Otherwise, the control circuit 107 generates the adjusting signal Sad to prolong the delay time of the second delay unit 1024 and keep the delay time of the first delay unit 1022 intact to make the converted amplitude component Sca synchronizes with the converted phase component Scp or make the converted amplitude component Sca and the converted phase component Scp reach the mixing circuit 106 substantially at the same time (Step 4054).

Briefly, by setting the compensation filter 1052, the sigma delta modulator 1054, and the phase locked loop 1056 of the polar transmitter 100 to have the constant group delay from the phase component Sp to the converted phase component Scp, the present invention detects the AM group delay Td1 and the constant PM group delay Td2 of the AM path 16 and the PM path 14 respectively. Then, the present embodiment delays the in-phase component Si and the quadrature component Sq before being inputted into the second processing circuit 103 according to the AM group delay Td1 and the constant PM group delay Td2 such that the converted amplitude component Sca synchronizes with the converted phase component Scp or reach the mixing circuit 106 substantially at the same time.

Those skilled in the art will readily observe that numerous modifications and alterations of the device and method may be made while retaining the teachings of the invention.

What is claimed is:

1. A polar transmitter, comprising:
   a processor, arranged to convert signals from a specific coordinate system to a polar coordinate system, wherein the signals in the polar coordinate system comprises a phase component and an amplitude component;
   a phase modulation (PM) path, configured to have a constant PM group delay, for processing the phase component;
   an amplitude modulation (AM) path, of which an AM group delay is capable of being determined, for processing the amplitude component; and
   an adjustable delay circuit, arranged to adjust delay of the signals in the specific coordinate system according to the constant PM group delay and the determined AM group delay.

2. The polar transmitter of claim 1, wherein the processor is a Coordinate Rotation Digital Computer (CORDIC), and the specific coordinate system is an in-phase/quadrature (I/Q) coordinate system.

3. The polar transmitter of claim 1, wherein the AM path comprises:
   a digital to analog converter (DAC) for converting the amplitude component from a digital domain to an analog domain; and
   a filter, coupled to the DAC, for filtering the converted amplitude component in the analog domain.

4. The polar transmitter of claim 1, further comprising:
   a signal generator, arranged to providing a test signal to the AM path comprising a DAC, wherein the test signal is processed by the DAC to generate a processed test signal;
   a phase detector, arranged to detect a phase difference between the test signal and the processed test signal;
   a calibrating circuit, arranged to determine the AM group delay according to the phase difference.

5. The polar transmitter of claim 1, wherein the PM path comprises:
   a phase locked loop arranged to process the PM component;
   a compensation filter, configured to compensate a delay caused by at least the phase locked loop so as to substantially keep the PM path having the PM constant group delay.

6. The polar transmitter of claim 1, wherein a frequency response of the PM path acts as a filter with the constant PM group delay.

7. The polar transmitter of claim 2, wherein the signals in the I/Q coordinate system comprises an in-phase components and a quadrature component, and the adjustable delay circuit comprising:
   a first delay unit for delaying the in-phase component; and
   a second delay unit for delaying the quadrature component;
   wherein the adjustable delay circuit is arranged to delay at least one of the in-phase component and the quadrature component while the PM path and the AM path are not synchronous.

8. The polar transmitter of claim 4, wherein the calibrating circuit comprises:

a successive approximation register (SAR), arranged to generate a code having a plurality of bits according to the phase difference;

a SINE ROM table, arranged to store a plurality of candidate delay times mapped to a plurality of candidate values of the code; and a delay setting circuit, arranged to set a delay time by selecting a candidate delay time from the SINE ROM table according to an actual value of the code, and provide the delay time upon the test signal to update the test signal;

wherein the AM group delay is derived from the delay time of which the delay time makes the phase difference between the test signal and the processed test signal substantially equals zero.

9. The polar transmitter of claim 5, further comprising a control circuit arranged to calibrate a time constant and a loop gain of the phase locked loop.

10. The polar transmitter of claim 5, wherein the compensation filter is coupled between the processor and the phase locked loop.

11. The polar transmitter of claim 7, further comprising:
a control circuit, arranged to control the adjustable delay circuit by an adjusting signal indicative of a time difference between the constant PM group delay and the calibrated AM group delay.

12. A signal transmitting method of a polar transmitter comprising a phase modulation (PM) path and an amplitude modulation (AM) path, comprising:

converting signals from a specific coordinate system to a polar coordinate system, wherein the signals in the polar coordinate system comprises a phase component and an amplitude component;

determining an AM group delay of the AM path; and adjusting delay of the signals in the specific coordinate system according to a constant PM group delay and the determined AM group delay;

wherein the PM path is configured to have the constant PM group delay.

13. The signal transmitting method of claim 12, wherein the specific coordinate system is an in-phase/quadrature (I/Q) coordinate system, and the signals in the I/Q coordinate system comprises an in-phase components and a quadrature component, and the step of adjusting delay of the signals in the specific coordinate system comprises:

delaying at least one of the in-phase component and the quadrature component while the PM path and the AM path are not synchronous.

14. The signal transmitting method of claim 12, wherein the AM path comprises:

a digital to analog converter (DAC) for converting the amplitude component from a digital domain to an analog domain; and a filter, coupled to the DAC, for filtering the converted amplitude component in the analog domain.

15. The signal transmitting method of claim 12, wherein the step of determining the AM group delay of the AM path comprises:

providing a test signal to the AM path comprising a DAC, wherein the test signal is processed by the DAC;

determining the AM group delay according to a phase difference between the test signal and the processed test signal.

16. The signal transmitting method of claim 12, wherein the PM path comprises:

a phase locked loop, arranged to process the PM component;

a compensation filter, configured to compensate a delay caused by at least the phase locked loop so as to substantially keep the PM path having the PM constant group delay.

17. The signal transmitting method of claim 12, wherein a frequency response of the PM path acts as a filter with the constant PM group delay.

18. The signal transmitting method of claim 15, wherein the step of determining the AM group delay comprises:

generating a code having a plurality of bits according to the phase difference;

arranging a SINE ROM table to store a plurality of candidate delay times mapped to a plurality of candidate values of the code;

setting a delay time by selecting a candidate delay time from the SINE ROM table according to an actual value of the code;

providing the delay time upon the test signal to update test signal; and deriving the AM group delay according to the delay time of which the delay time makes the phase difference between the test signal and the processed test signal substantially equals zero.

19. The signal transmitting method of claim 16, wherein a time constant and a loop gain of the phase locked loop are calibrated.

20. The signal transmitting method of claim 16, wherein the phase component is compensated by the compensation filter before processed by the phase locked loop.

* * * * *